United States Patent [19]
Doun et al.

[11] Patent Number: 5,929,376
[45] Date of Patent: Jul. 27, 1999

[54] ELECTROMAGNETIC INTERFERENCE SHIELD AND METHOD OF MANUFACTURING

[75] Inventors: Tok Doun, Tigard; James H. McGrath, Jr., Aloha; Delmer E. Snyder, Hillsboro, all of Oreg.

[73] Assignee: Tektronix, Inc., Wilsonville, Oreg.

[21] Appl. No.: 08/879,950

[22] Filed: Jun. 20, 1997

[51] Int. Cl.⁶ ............................................. H05K 9/00
[52] U.S. Cl. ........................... 174/35 R; 174/35 GC; 361/686; 361/800; 361/801; 361/816
[58] Field of Search ............................ 174/35 GC, 35 R, 174/51; 361/816, 818, 800, 799, 753, 686, 801; 439/607, 61

[56] References Cited

U.S. PATENT DOCUMENTS

| 5,225,629 | 7/1993 | Garrett | 174/35 R |
|---|---|---|---|
| 5,650,922 | 7/1997 | Ho | 361/799 |
| 5,679,923 | 10/1997 | Le | 174/35 R |

*Primary Examiner*—Kristine Kincaid
*Assistant Examiner*—Hung V Ngo
*Attorney, Agent, or Firm*—Bennet K. Langlotz; William K. Bucher

[57] ABSTRACT

An instrument housing defines a chamber and has a metal shell with an aperture region defining an array of parallel elongated apertures. The shell has an elongated web between each pair of adjacent apertures, and a raised element protrudes from the web. The raised element is spaced apart from each aperture to reveal a portion of the web near each aperture. A resilient, electrically conductive spring element is electrically connected to the web and has a compressible portion extending away from the web, such that a metal plate pressed toward the revealed surface makes electrical contact with the spring and thereby to the shell, and is laterally constrained by the raised element. The raised element may be welded to the web with the spring captured between, or the raised element may be partially sheared to protrude from the web, with an aperture in the spring closely receiving the raised portion with an interference fit.

16 Claims, 8 Drawing Sheets

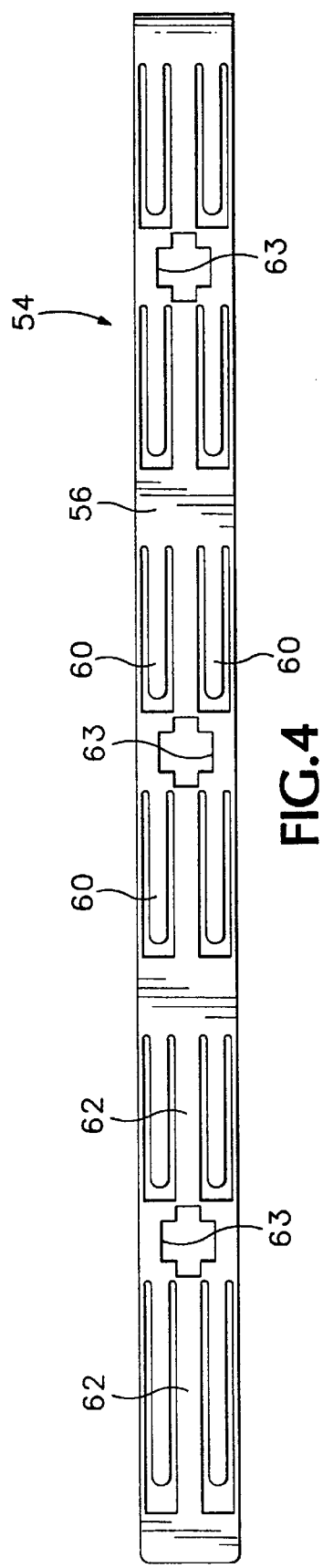
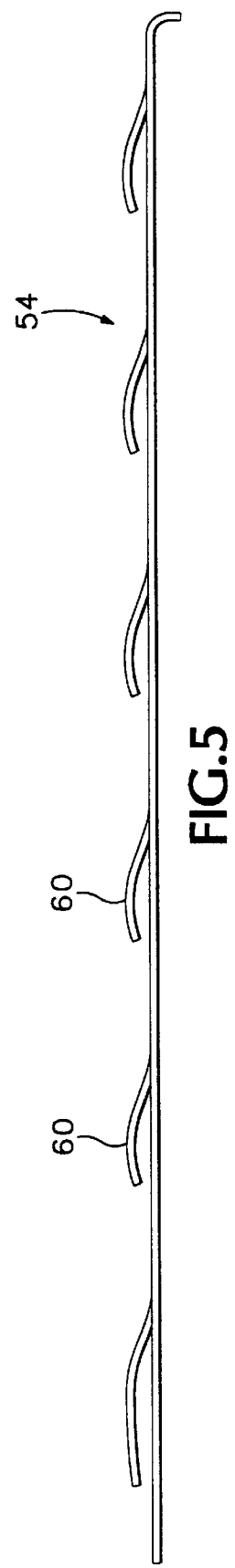
FIG.4
FIG.5

5,929,376

ELECTROMAGNETIC INTERFERENCE SHIELD AND METHOD OF MANUFACTURING

FIELD OF THE INVENTION

The invention relates to shields for reducing electromagnetic interference from electronic instruments, and more particularly to flexible conductive gaskets providing ohmic contact between portions of an instrument housing.

BACKGROUND AND SUMMARY OF THE INVENTION

Electromagnetic interference (EMI) is a well known problem with electronic instruments having circuitry operating at high frequencies. Uncontrolled EMI from one instrument may interfere with the operation of other nearby sensitive electronic instruments. Accordingly, EMI has been governmentally regulated to limit the amount of tolerated EMI emissions.

To control, limit, or avoid EMI emissions, instruments are often shielded by use of metal housings. Housing openings are limited in size to limit the wavelengths of signals that may be emitted. Seams or apertures at which doors, panels, and lids are installed are provided with conductive edge springs or gaskets to electrically "close" or shorten the length of any elongated gaps.

EMI has been well known in high speed instrumentation operating in the range of several Gigahertz, where shielding must close any gaps more than about 1 cm. With the generally high value of such instruments, the cost to provide adequate shielding has been tolerable. However, low cost personal computers and other consumer appliances use increasingly high speed processors that make cost effective EMI control an important concern.

One particular area of concern in personal computers is the array of I/O apertures that provide access to the removable I/O cards. These include modems, video circuits, and sound cards. Each card has a row of conductive pads on one major edge that is received by an edge connector on the mother board of the computer, and has a perpendicular metal plate at one end of the card that covers an I/O aperture when the card is installed. A connector mounted to the plate is normally connected to a cable that extends to a device outside of the computer.

As I/O apertures are about 10 cm long, the gap between the I/O card plate and the apertures in the housing panel requires shielding. Conventional metal spring gaskets have proven unsuitable because the tight space constraints between apertures prevent the use of conventional fasteners. With the standard 0.8" (20.3 mm) pitch between apertures, and the standard 0.73" (18.5 mm) plate width, there is only a gap of 0.07" (1.8 mm) between the edges of properly positioned adjacent I/O card plates. This is inadequate for the heads of conventional fasteners such as screws and rivets. Because the plates must be pressed flush against the housing panel, protrusions must be limited to the narrow gap between plates.

To avoid oversize protrusions, adhesive attachment of spring gaskets and conductive elastomeric gaskets have been proposed, but these lack the durability required for repeated insertions and removals of I/O cards, particularly by inexperienced users. Adhesives have a limited life span, and soft materials are susceptible to tearing and other damage. In addition, these proposed approaches lack the means to prevent the misalignment of I/O cards that may wobble in their edge connector.

The embodiments disclosed herein overcome these limitations by providing an instrument housing that defines a chamber and has a metal shell with an aperture region defining an array of parallel elongated apertures. The shell has an elongated web between each pair of adjacent apertures, and a raised element protrudes from the web. The raised element is spaced apart from each aperture to reveal a portion of the web near each aperture. A resilient, electrically conductive spring element is electrically connected to the web and has a compressible portion extending away from the web, such that a metal plate pressed toward the revealed surface makes electrical contact with the spring and thereby to the shell, and is laterally constrained by the raised element. The raised element may be welded to the web with the spring captured between, or the raised element may be partially sheared to protrude from the web, with an aperture in the spring closely receiving the raised portion with an interference fit.

BRIEF DESCRIPTION OF THE DRAWINGS

FIG. 4 is an enlarged plan view of the spring portion of the embodiment of FIG. 1.

FIG. 5 is a side view of the spring portion of the embodiment of FIG. 1.

FIG. 8b is an enlarged sectional view of a portion of the embodiment of FIG. 7 taken along line 8b—8b of FIG. 8a.

DETAILED DESCRIPTION OF A PREFERRED EMBODIMENT

Figure 1:
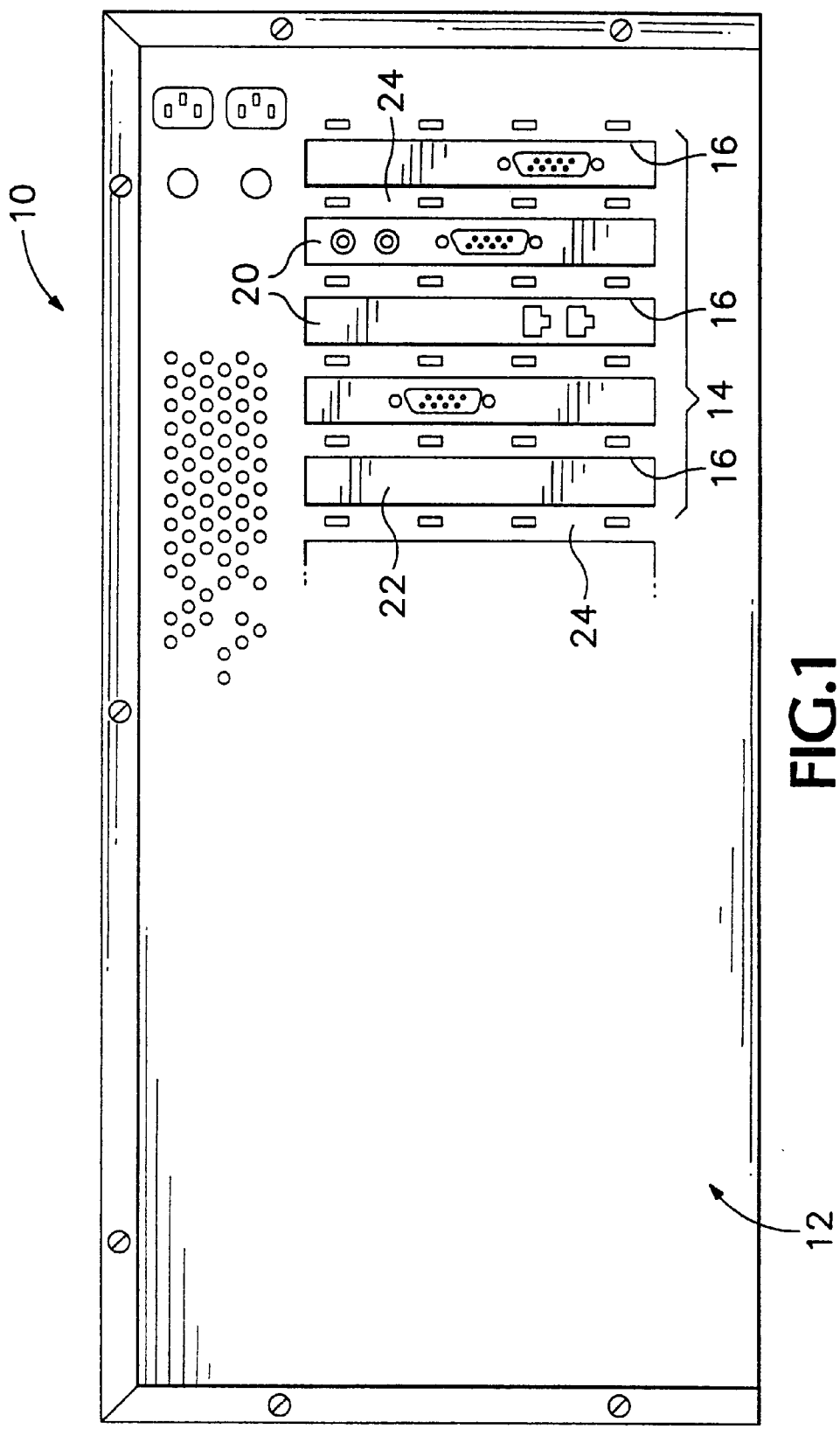
FIG. 1 is an exterior rear view of an instrument housing according to a preferred embodiment of the invention.

FIG. 1 shows a computer housing 10 formed of folded sheet metal. A rear panel 12 has an aperture portion 14 that defines an array of parallel elongated rectangular I/O (input/output) apertures 16 that provide openings to a chamber in the interior of the housing. Within each aperture, a portion of a metal plate 20 attached to an I/O card is visible, so that each aperture is blocked against entry of foreign bodies and to control cooling air flow into and out of the housing. Where I/O cards are not present, a dummy plate 22 blocks the aperture. An elongated web 24 of the rear panel material separates each aperture from its neighbors, and provides a surface against which the I/O plate 20 may rest, as will be discussed in detail below. In the preferred embodiment, the housing is formed of stamped and folded sheet metal, with the webs being the material remaining after the apertures are stamped.

Figure 2:
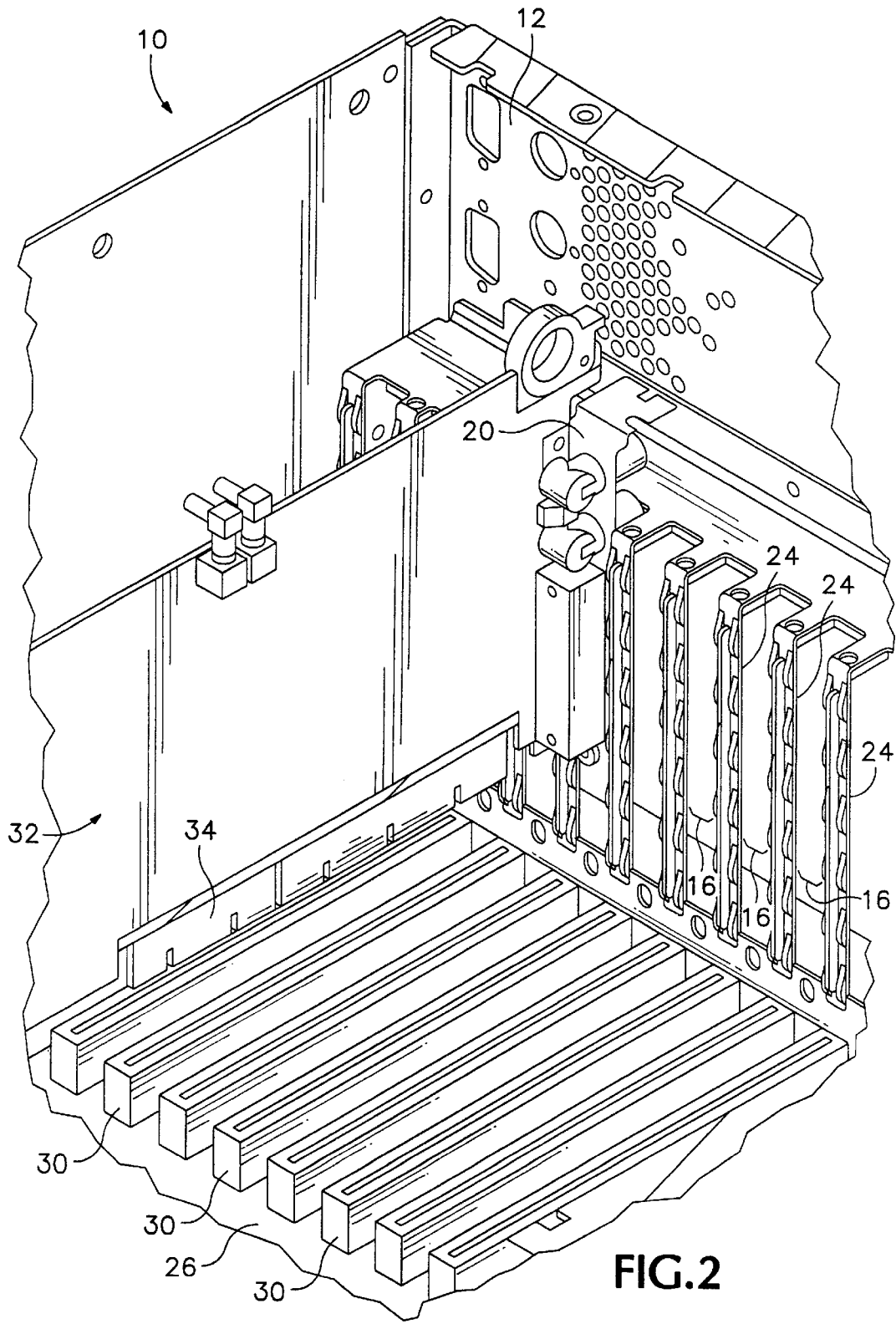
FIG. 2 is a perspective cut away view of the interior of the embodiment of FIG. 1.
Figure 3:
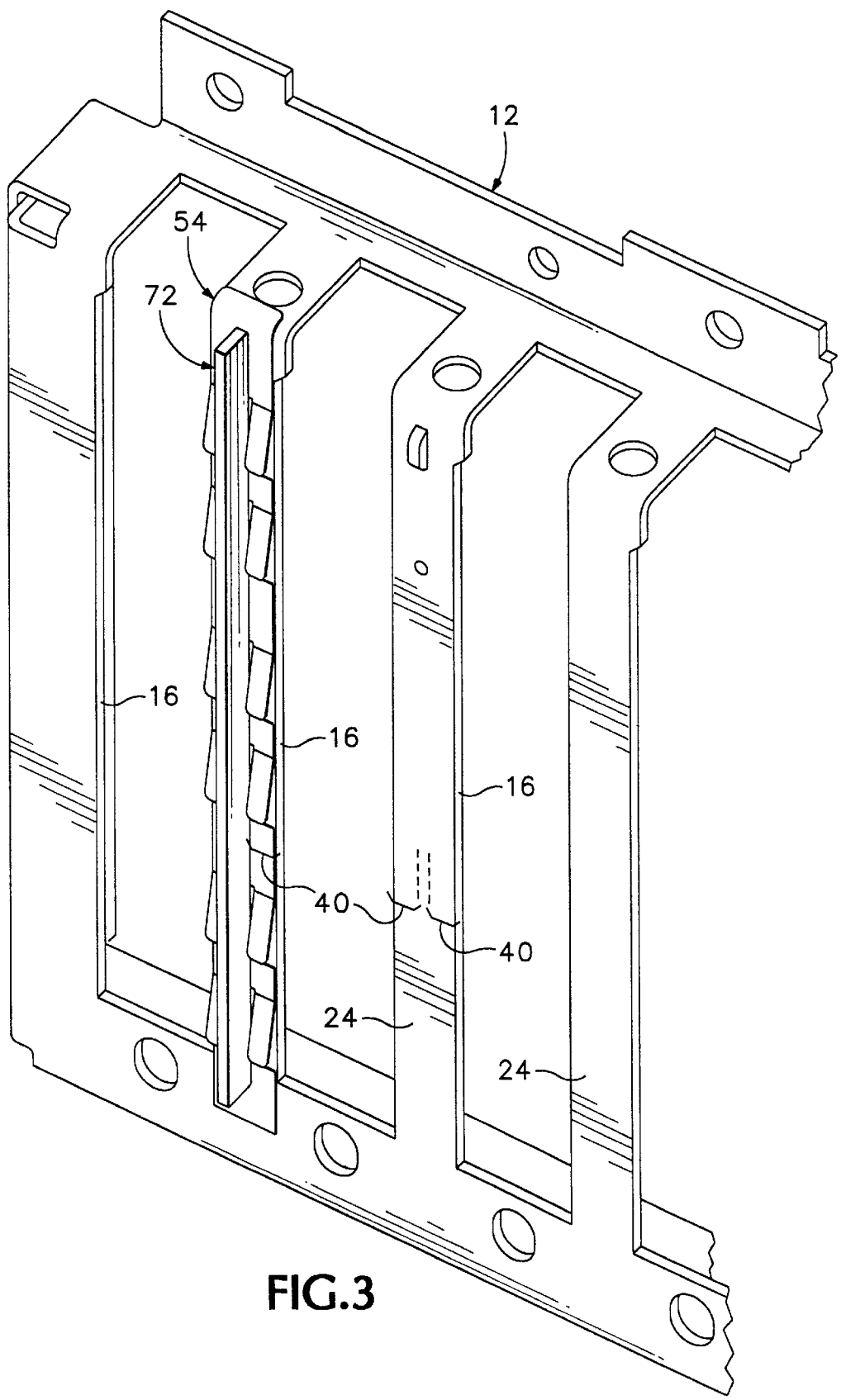
FIG. 3 is an enlarged fragmentary view of a portion of the embodiment of FIG. 1.

As shown in FIG. 2, the interior of the housing contains a motherboard 26 oriented perpendicularly to the long axes of the rear apertures 16. An array of edge connectors 30 connected to the mother board are arranged so that each corresponds to an I/O aperture. An I/O board 32 having a connector edge 34 with an array of conductive pads is inserted in a selected connector 30. When installed, the plate 20 covers a selected aperture 16. FIG. 3 shows a spring 54 secured against a web 24 by a reinforcing bar 72, so that an I/O plate presses against points along the spring to make electrical connects as a shield against EMI. Each web is provided with such a spring and bar assembly to provide rigidity, especially to prevent bowing of the webs in response to a plate pressing against the spring, which may lead to a lower spring compression in the middle portions of the web. This is undesirable in the highest speed instruments in which this embodiment is used. The reinforcing bar is also a guide to facilitate installation of the I/O boards. The I/O plates are closely constrained by the bars, so that a plate may not slip laterally out of position so that it loses contact with the spring arms on one side. If this were to occur, an edge of the plate may catch on and damage the spring arm when returned to its proper position.

Each bar 72 extends approximately the length of the spring and web, and has a height of 0.125" (3.2 mm). Each bar is approximately centered on the web, and protrudes perpendicularly from the rear panel toward the interior of the chamber. The bars are aligned with an approximately equal flat revealed portion 40 of the interior web surface on each side of the bar. In the preferred embodiment, and according to industry standards, the apertures 16 are located with a center-to-center pitch of 0.80" (20.3 mm). The aperture width is 0.53" (13.4 mm), providing a web width of 0.27" (6.9 mm). The bars have a width of 0.048" (1.22 mm), providing a revealed region width of 0.11" (2.8 mm) on each side. As the standard width of the I/O plate, 0.73" (18.5 mm), is only slightly less than the spacing between the facing surfaces of the bars on adjacent webs, the I/O plate is securely positioned between the rows of bars when installed. This prevents misalignment of the I/O cards and potential damage to opposing gasket fingers.

FIGS. 4 and 5 show the details of the elongated spring 54, which is also shown in FIG. 3 as installed on a web 24. The spring is a thin metal sheet that has been stamped and formed to have approximately the same length and width as the web 24 on which it is mounted. Each web is provided with a spring, as are the portions of the panel 12 that border the end most apertures 16. Each spring includes a flat base portion 56 that extends the length of the spring, and which rests flat against the inner surface of a web. Periodically along the length of the spring, pairs of raised arms 60 extend away from the plane of the base. Each arm extends parallel to the edge of the spring, and has a gently curved upper surface so that the I/O plate may slide smoothly over the arm without catching on any sharp edges. To limit the electrical gap through which EMI may escape, the spring arms are arranged at a pitch of 0.70" (17.8 mm). Each arm has a width nearly as wide as the width of the web's revealed portion, although this is limited only by the structural strength requirements of the narrow base portion 62 that separates the arms. At periodic intervals along the length of each spring, an attachment aperture 63 is defined at the mid line to permit attachment methods discussed below.

Figure 6:
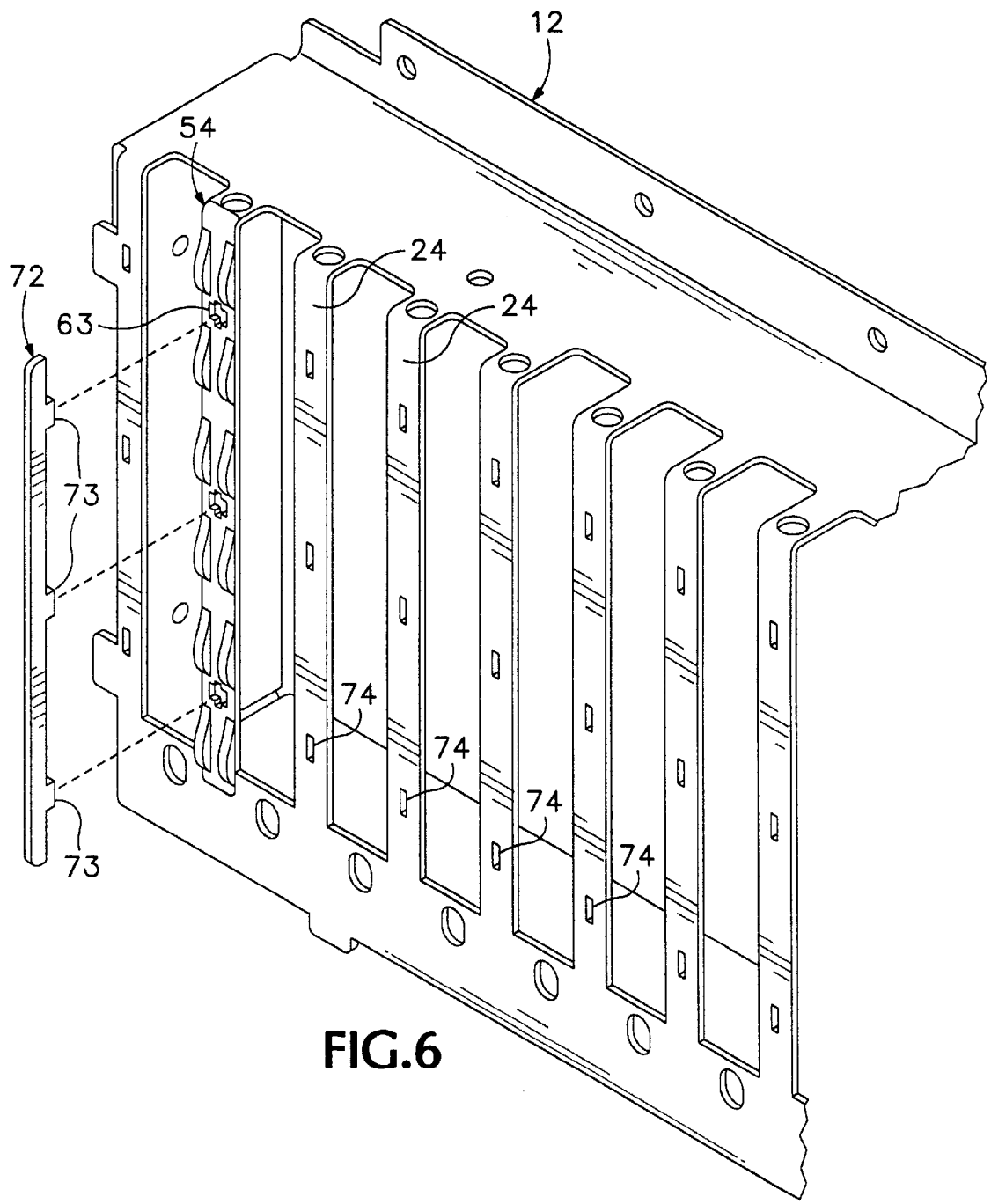
FIG. 6 is an exploded view of the embodiment of FIG. 1.

The assembly of the preferred embodiment is shown in FIG. 6, in which the spring 54 is captured between a flat web 24 and the rigid steel separator bar 72. Each bar includes three protruding integral tabs 73 along a major edge, registered with the spring apertures 63 and sized to be received therein. The tabs protrude by a length equal to the thickness of the webs so that the tab ends are flush when installed as will be discussed below. Each web includes a similar aperture 74 registered with the tabs and spring apertures 63. To manufacture the assembly, a set of the bars 72 are positioned on edge in a fixture with their tabs upward in a spaced apart array corresponding to their final positions. Then, a complete set of the springs is positioned on the fixture, with a spring placed on each bar so that the tabs protrude through the spring apertures. The rear panel is placed over the fixtured bars so that the tabs penetrate the web apertures 74. Then, the bars are secured in position permanently.

A permanent connection between the bars and the webs may be made by any one of several methods. In the preferred embodiment, the bars are swaged to the webs by an interference fit. Instead of the solid tabs shown, the tabs each also may be formed as a pair of spaced apart teeth with a notch in between, with the teeth spaced apart wider than the web apertures 74 to generate a press fit. Also, each tab may be provided with a hole or recess on its major surface; after the bars are positioned, the surface of the web near the tabs may then be deformed by a perpendicular point force to extrude or cold flow the web material into the tab hole to prevent its withdrawal. Alternatively, attachment may be made by spot welding the exposed ends of the tabs from the rear face of the panel 12, or by any other welding, soldering, or mechanical process to generate a strong mechanical and electrical connection.

Alternative Embodiment

In an alternative embodiment of the invention, the spring 54' may be provided with apertures to permit mechanical attachment to raised elements on each web. This embodiment may be used where rigidity is less critical, and where simplified manufacturing is desired.

Figure 7:
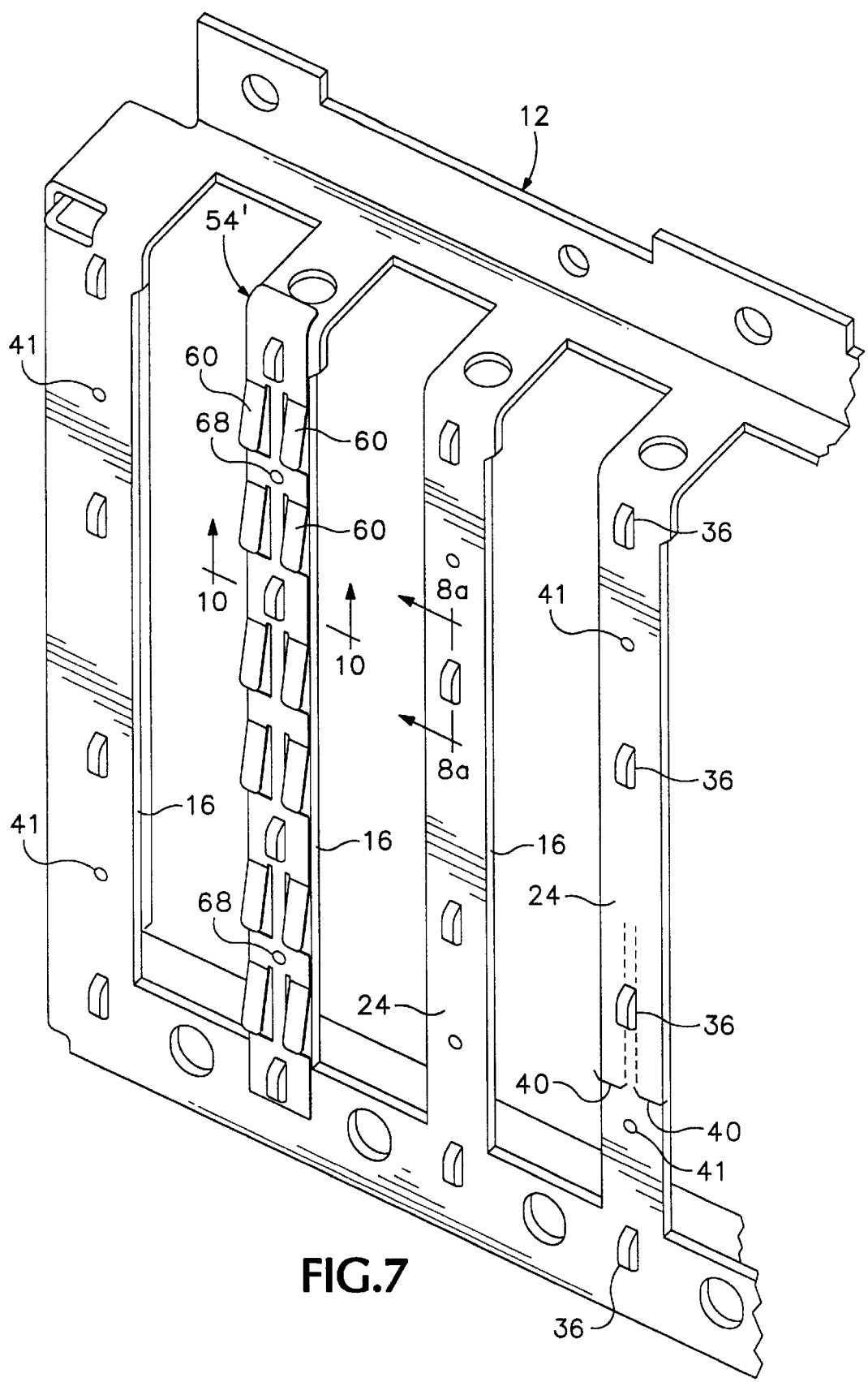
FIG. 7 is an enlarged fragmentary view of an alternative embodiment of the invention.

FIG. 7 shows the rear plate 12 of the alternative embodiment. Each web 24 is provided with several partially sheared or stamped raised portions 36 along its length. As in the preferred embodiment, each raised portion is centered on the web, and protrudes perpendicularly from the rear panel toward the interior of the chamber by a distance at least as great as the thickness of the web. The raised portions are aligned on a midline of the web, with an equal flat revealed portion 40 of the interior web surface on each side of the row of raised portions. The raised elements have the same width and positioning as the bar of the preferred embodiment, and similarly prevent misalignment of the I/O cards and potential damage to opposing gasket fingers. Each web also defines a pair of small alignment holes 41, one near each end of each web. These small diameter holes are centered on the web, and positioned midway between a pair of end most elevated portions.

Figure 8A:
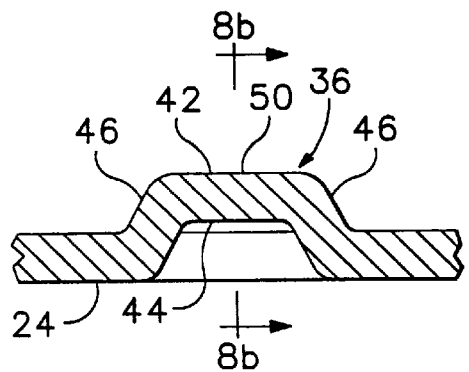
FIG. 8a is an enlarged sectional view of a portion of the embodiment of FIG. 7 taken along line 8—8 of FIG. 7.
Figure 8B:
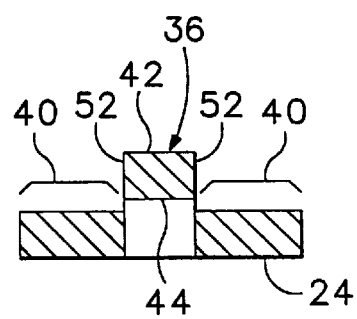
Figure 9:
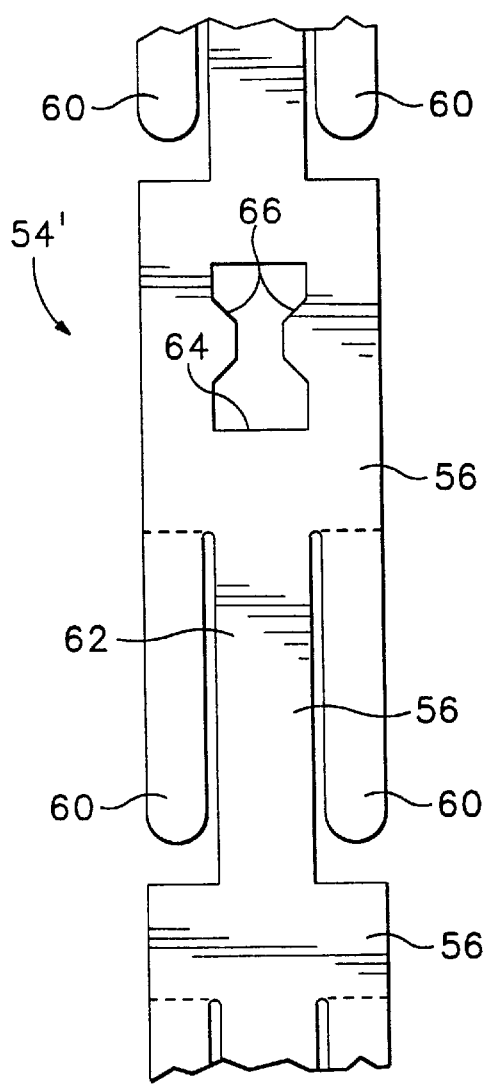
FIG. 9 is an enlarged plan view of the spring portion of the embodiment of FIG. 7.
Figure 8C:
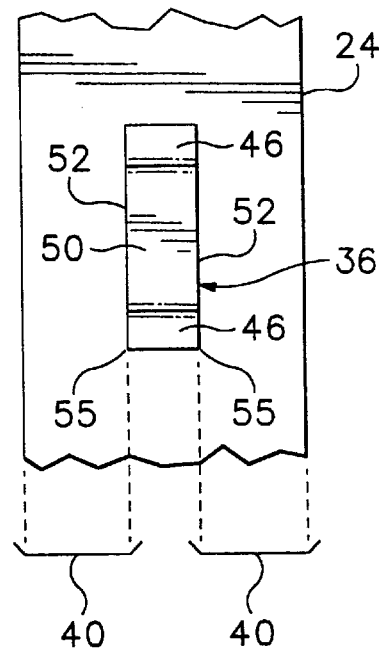
FIG. 8c is an enlarged plan view of a portion of the embodiment of FIG. 7.

As shown in FIGS. 8a, 8b, and 8c each raised element is a partially sheared or stamped band that is displaced perpendicularly from the inner surface of the web 24. Each band has an elevated upper surface 42 and an opposed lower surface 44. In this embodiment, with the sheet metal web having a thickness of 0.05" (1.3 mm), and the upper surface of the raised portion being elevated above the upper surface of the web by 0.06" (1.5 mm), the lower surface of the raised portion is above the upper surface of the web, creating an apparent gap as shown in FIG. 8a. This is not essential, but it is believed to provide enhanced security of spring attachment, as will be discussed below.

Each raised element has opposed sloped ends 46 that provide a continuous and rigid transition between a central portion 50 of the raised element and the surface of the flat web 24. The raised element has parallel sheared straight sides 52 that face in opposite directions perpendicular to the plane and axis of the web. As shown in FIG. 8c, these are formed by parallel shear lines 55 that are spaced apart by the width of the raised portion, and which define the boundaries with the revealed portions 40. In this, the central portion has a length of about 0.10" (2.5 mm) and the shear lines have a length of 0.13" (3.3 mm). On each web, there are 4 raised elements, spaced apart evenly by about 1.3" (3.3 cm).

At periodic intervals along the length of each spring 54', an attachment aperture 64 is defined in the base. The aperture 64 is defined in the portion of the base that spans the full width of the spring so that sufficient material remains on either side of the aperture for structural strength. The aperture has an elongated rectangular overall shape aligned with the major axis of the spring. The aperture has an hourglass appearance due to a pair of opposed tabs 66 that extend inwardly from the long sides of the aperture. Overall, the aperture has a length and width slightly greater than the dimension of the corresponding raised element 36. The distance between the ends of the tabs is slightly less than the width of the raised element, In the preferred embodiment, the aperture is 0.20" (5.1 mm) long, 0.06" (1.5 mm) wide, and the gap between the tabs is 0.02 (0.5 mm).

Referring back to FIG. 7, each spring 54' defines a pair of alignment holes 68 that registers with the alignment holes 41 when the spring is properly installed. This permits the use of a manufacturing fixture (not shown) having a pair of pins that extend through the alignment holes in each web, and protrude further to permit the spring to be placed over the pins prior to engaging the attachment apertures to the raised elements.

Figure 10:
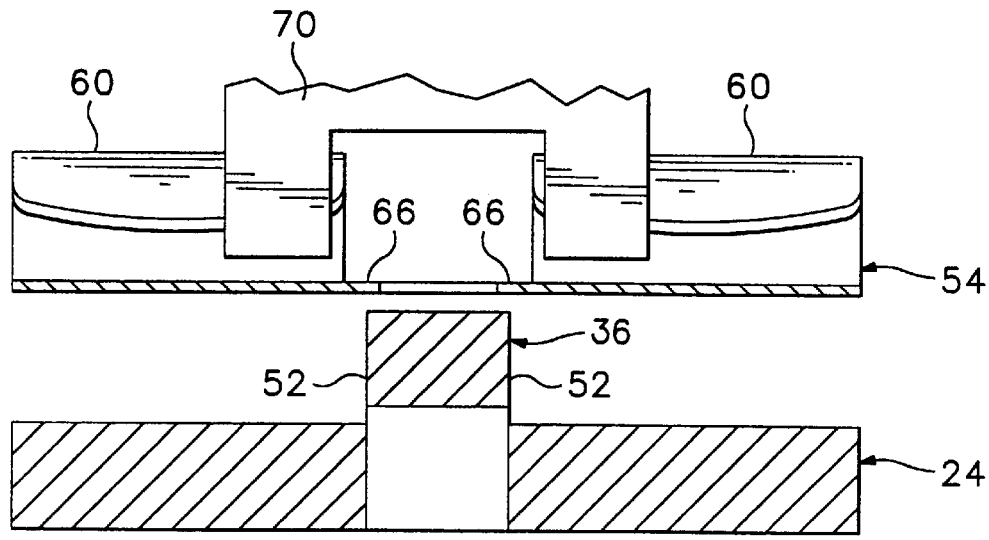
FIG. 10 is an enlarged sectional view of a portion of the embodiment of FIG. 7 taken along line 10—10 of FIG. 7, showing an intermediate manufacturing step.
Figure 11:
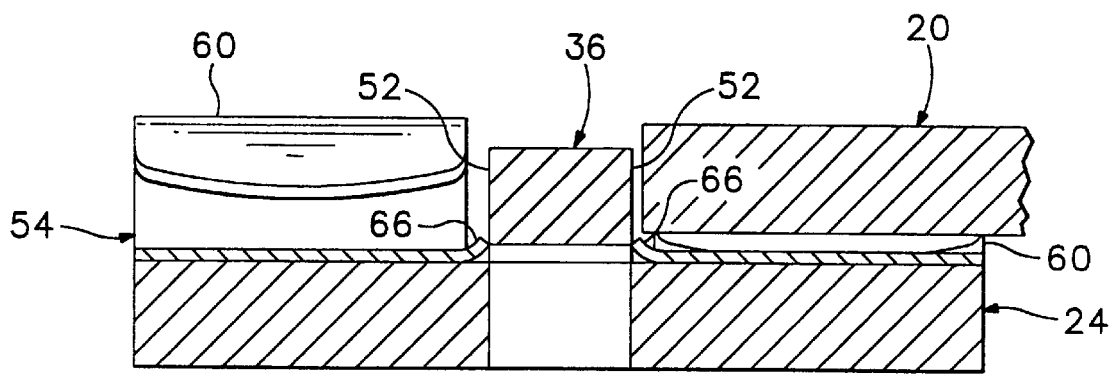
FIG. 11 is an enlarged sectional view of a portion of the embodiment of FIG. 7 taken along line 10—10 of FIG. 7.

As shown in FIGS. 10 and 11, the spring 54' is installed on the web 24 by forcing the aperture over the raised element 36. A tool 70 having a prong on either side of the raised element presses on the base of the spring immediately on each side of the aperture, but sufficiently away from the ends of the tabs to permit them to flex, as shown in FIG. 7. As the spring is forced downward, the tabs flex upward and scrape over the side surfaces 52, biting into the surface to resist removal when fully installed.

Although the tabs may be sized to slip entirely under the raised element when installed, this is believed not to be necessary for a secure connection. However, if such an installation is desired, to provide for more ready removal and possible reuse of the springs, the raised element may be elevated higher above the surface of the web, the spring may be made more flexible, and the dimensional interference between the tabs and the raised element reduced. Nonetheless, in this embodiment, the spring may be removed after installation by the deliberate but moderate effort of a skilled worker using a pliers to grip the spring at one end.

As further shown in FIG. 11, the I/O card plate 20 is installed to compress the spring arm 60 to a nearly flat position, positioning the plate to within 0.02" (0.5 mm) of the web surface as required by typical specifications. Because the tabs are short and the bent portion very limited in height and width, they are not a factor in preventing the plate from fully seating as shown. In the preferred embodiment, the plate is sized to be slightly narrower than the space between the raised portion side surfaces 52 that capture it laterally, avoiding any interference should manufacturing dimensions vary. When the installation is complete, each aperture will be filled with a plate 20 so that all springs are compressed.

Although not illustrated, the web may be stamped with additional raised elements and the spring provided with apertures lacking the tabs, so that the spring may be loosely installed on these tabs before the press fitting step proceeds manually or by an automated process. In the preferred embodiment, the spring is formed of BeCu-C17200, full hard, and has a thickness of 0.003" (0.08 mm). Other suitable materials, such as stainless steel may be substituted to provide strength, resilience, conductivity, and corrosion resistance.

While the disclosure is made in terms of a preferred embodiment, the invention is not intended to be so limited. What is claimed is:

1. An instrument housing defining a chamber and comprising:
    a metal shell having an aperture region defining an array of at least a pair of adjacent parallel elongated apertures;
    the shell having an elongated web between said pair of adjacent apertures;
    the web having a major surface from which a raised element protrudes;
    the raised element being spaced apart from each aperture such that a revealed portion of the major surface of the web separates the raised element from the apertures; and
    a resilient, electrically conductive spring element electrically connected to the web and having a compressible portion extending away from the revealed portion of the web, such that a metal plate pressed toward the revealed portion makes electrical contact with the spring element and thereby to the shell, and is laterally constrained by the raised element.

2. The housing of claim 1 wherein the raised element is separated from the web by the spring element.

3. The housing of claim 1 wherein the raised element is an elongated strip.

4. The housing of claim 1 wherein the raised element is connected to the web using at least one weld.

5. The housing of claim 4 wherein the spring element is captured between the raised element and the web.

6. The housing of claim 1 wherein the raised element is integral with the web.

7. The housing of claim 1 wherein the web is a planar sheet having parallel surfaces and a selected thickness, and wherein the raised element has substantially the same thickness and is perpendicularly displaced from the sheet.

8. The housing of claim 1 wherein the raised element has a periphery including two opposed edge surfaces perpendicular to the web.

9. The housing of claim 8 wherein the edge surfaces are spaced apart from each other.

10. The housing of claim 8 wherein the spring defines an attachment aperture receiving the raised element, and wherein the spring includes a pair of opposed tabs extending into the attachment aperture and spaced apart by less than the distance between the opposed edge surfaces, such that the tabs provide an interference fit with the raised element.

11. The housing of claim 1 wherein the raised element is perpendicularly displaced from the web, and has at least a first peripheral portion discontinuous with the web and a second peripheral portion continuous with the web.

12. The housing of claim 11 wherein the raised element is a band with a central portion perpendicularly displaced from the web, and has opposed ends that slope to continuously join with the surface of the web, and has opposed edges extending between the ends that are discontinuous with the surface of web.

13. The housing of claim 1 wherein the spring element defines an attachment aperture registered with the raised element.

14. The housing of claim 13 wherein the attachment aperture has at least one dimension smaller than the raised element, such that placing the attachment aperture over the raised element provides a secure press fit.

15. The housing of claim 13 wherein the attachment aperture has a major periphery sized larger than the raised element to loosely receive the raised element, and wherein the spring element includes a tab extending inwardly into the attachment aperture from the major periphery, such that the tab contacts and secures the raised element when the spring element is installed.

16. The housing of claim 1 wherein the aperture region is formed of sheet metal.

* * * * *